United States Patent

Boscolo et al.

[11] Patent Number: 6,150,963
[45] Date of Patent: Nov. 21, 2000

[54] METHOD AND SYSTEM FOR COMPENSATING FOR VARIATIONS IN SUPPLY VOLTAGE APPLIED TO PULSE WIDTH MODULATION CONVERSION CIRCUITS

[75] Inventors: Michele Boscolo, Sottomarina; Ezio Galbiati, Agnadello; Marco Vitti, Sesto San Giovanni, all of Italy

[73] Assignee: STMicroelectronics S.r.l., Agrate Brianza, Italy

[21] Appl. No.: 09/304,678

[22] Filed: May 4, 1999

[51] Int. Cl.$^7$ ........................................ H03M 5/08
[52] U.S. Cl. ................................................. 341/53
[58] Field of Search ............................ 341/53, 155, 50; 375/295, 316

[56] References Cited

U.S. PATENT DOCUMENTS 6,014,093  1/2000  Hayes ............................................ 341/53

*Primary Examiner*—Brian Young
*Attorney, Agent, or Firm*—Theodore E. Galanthay; Allen, Dyer, Doppelt, Milbrath & Gilchrist, P.A.

[57] ABSTRACT

A method and system produce a PWM signal using a comparator having first and second input terminals and an output terminal at which the PWM signal is produced. The method includes powering the comparator with a supply voltage and receiving a modulating signal at the first input terminal. The method creates a carrier signal with a constant frequency and a maximum amplitude equal to the supply voltage. The comparator receives the carrier signal at the second input terminal and compares the carrier signal to the modulating signal, thereby producing the PWM signal at the output terminal. By creating and using a carrier signal with a maximum amplitude equal to the supply voltage, the PWM signal produced by the method is immune from changes in the supply voltage.

19 Claims, 2 Drawing Sheets

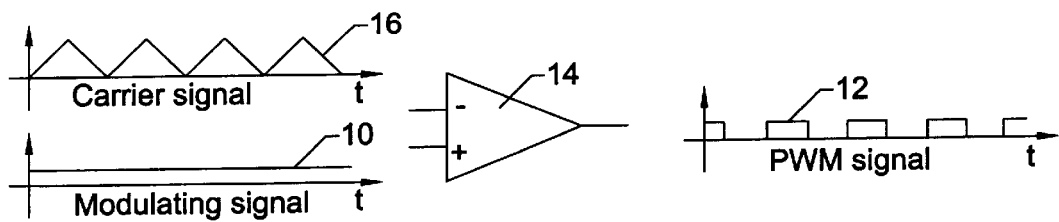
FIG. 1.
(PRIOR ART)
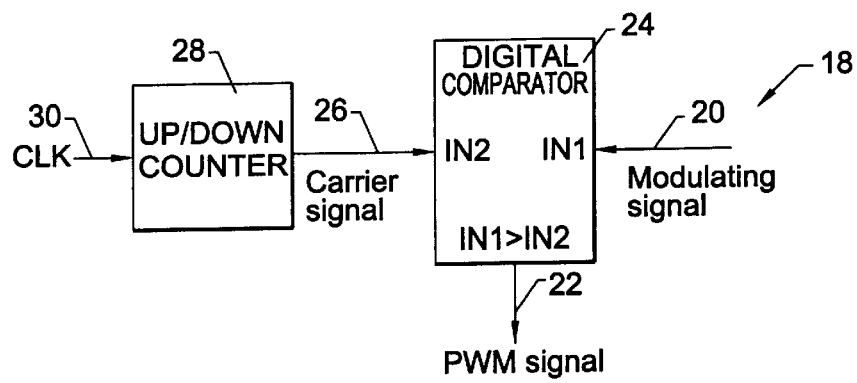
FIG. 2.
(PRIOR ART)
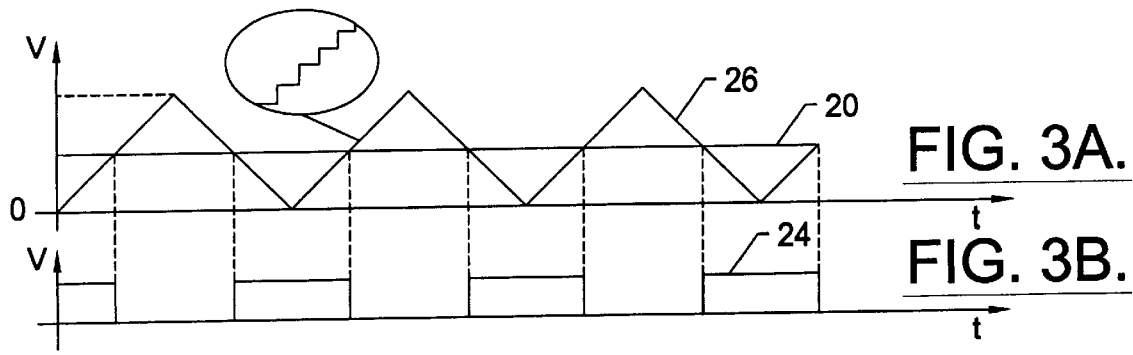
FIG. 3A.
FIG. 3B.

6,150,963

METHOD AND SYSTEM FOR COMPENSATING FOR VARIATIONS IN SUPPLY VOLTAGE APPLIED TO PULSE WIDTH MODULATION CONVERSION CIRCUITS

TECHNICAL FIELD

The present invention relates to pulse width modulation (PWM) systems, and more particularly, to an electronic circuit that compensates for variations in a supply voltage applied to a PWM conversion circuit.

BACKGROUND OF THE INVENTION

PWM (Pulse width modulation) signals, are digital signals of one bit (therefore of two levels) that are obtained from processing modulating signals. The modulating signal can be of the analog type (electrical voltage of any value between a maximum limit and a minimum limit) or of the digital type (having a value expressed as a digital number of N bits). PWM signals are often used in the area of power electronics, such as for driving a computer storage disk drive motor to accurately position the read/write heads over the portion of the disk desired to be written to or read from.

We now see how, from a digital or an analog modulating signal, one obtains a PWM signal.

Considering the case of an analog modulating signal 10, a possible method of conversion is that shown in FIG. 1. A PWM signal 12 is the result of an analog comparator 14 performing an analog comparison between the modulating signal 10 and the carrier signal 16 (typically of a triangular shape having a frequency, with respect to the modulating signal, normally higher at least by an order of magnitude). The carrier signal 16 can also be non-triangular. It can, for example, have a sawtooth profile.

In FIG. 1, one can note how, for each of value of the modulating signal 10 greater than the value of the carrier signal 16, the PWM signal 12 at the output of the analog comparator 14 assumes a logical one value. For each value of the modulating signal 10 less than the value of the carrier signal 16, the PWM signal 12 at the output of the analog comparator 14 assumes a logic zero.

Various values of the modulating signal 10 are in this way converted to a PWM signal 12 having pulses of various widths dependent on the value of the same modulating signal. Little by little the PWM signal 12 will be characterized by a certain duty cycle taken from the relationship between the duration of the logic one level (Ton) and the duration of the period of the same PWM signal (T).

The PWM signal 12 output by the comparator 14 includes a high frequency component (frequency of the carrier signal 16) and a low frequency component (the component due to the modulating signal 10). The average value of the PWM signal, little by little, is equal to Vcc times Duty-Cycle where: Vcc=the voltage value corresponding to logic level one and Duty-Cycle=Ton/T.

A digital conversion system 18 for converting a digital modulating signal 20 to a PWM signal 22 is shown in FIG. 2. The PWM signal 22 results from the comparison by a digital comparator 24 of the digital modulating signal 20 (digital number of N1 bits) and a digital carrier signal 26 (digital number of N2 bits) provided by a digital up/down counter 28.

In this particular example, the carrier signal 26 is obtained by the counter 28 counting "up" until an "end of count" (EOC) value is reached that, in this case, is equal to $2^{N2}-1$.

Upon reaching that value the counter 28 counts down until reaching the minimum possible value that, in the example, is equal to zero. Upon reaching the minimum possible value, the counter again counts "up" and so forth. A clock signal 30 is input to the counter 28 to provide timing for the counting. The period of the carrier signal 26 (taken from the time needed by the counter to count from the minimum possible value, that in the example is the value of zero, to $2^{N2}-1$ and again until the minimum possible value) will depend on the number of bits that the counter 28 is designed to output and on the frequency clock signal 30 input to the counter.

A timing diagram of the modulating 20, PWM 22, and carrier 26 signals is provided in FIG. 3. For simplicity, the carrier signal 26 is represented with a straight line rather than a stepped line of $2^{N2}-1$ steps.

FIG. 3 shows that, for each value of the modulating signal 20 greater than the value of the carrier signal 26, the output of the digital comparator 24 assumes a logic one value and for each of value of the modulating signal less than the value of the carrier signal, the output of the digital comparator assumes a logic zero value. Various values of the modulating signal 20 are converted in this way to the PWM signal 22 having pulse widths dependent on the value of the modulating signal. Little by little the PWM signal 22 will be characterized by a certain duty cycle taken from the relationship between the duration of the logical one level (Ton) and the duration of the period of the PWM signal (T).

Also in this case the PWM signal exiting from the digital comparator 24 includes a high-frequency component (at the frequency of the carrier signal 26) and a low frequency component (a component due to the modulating signal 20). The average value of the PWM signal, little by little, is equal to the Vcc times Duty-Cycle where: Vcc=the voltage value corresponding to logic level one (typically the supply voltage) and Duty-Cycle=Ton/T.

That result shows that the average value of the PWM signal output from the conversion circuit assumes various values according to the variations of the supply voltage. To clarify with a simple example, assume that the PWM signal 22 has a duty cycle of 50% and a supply voltage Vcc of 12 V+/−10%. When Vcc equals 10.8 V (12 V−10%), the average value of the PWM signal 22 will be 5.4 V (10.8*50%) and when Vcc equals 13.2 V (12 V+10%), the average value of the PWM signal Will be 6.6 V. Therefore, the average value of the PWM signal 22 can assume values between 5.4 V and 6.6 V.

Allowing the PWM signal 22 to vary based on the supply voltage is obviously undesirable because such a PWM signal 22 would not accurately convey the information or power sought to be conveyed by whichever system is supplying the modulating signal 20. For example, if a computer storage disk controller issues the modulating signal 20 at a particular value X in order to position the read/write head over a particular sector of the disk, if the PWM signal 22 being output based on that modulating system varies, then the PWM signal will not accurately position the read/write heads.

SUMMARY OF THE INVENTION

An embodiment of the invention is directed to a method of producing a PWM signal using a comparator having first and second input terminals and an output terminal at which the PWM signal is produced. The method includes powering the comparator with a supply voltage and receiving a modulating signal at the first input terminal. The method creates a carrier signal with a constant frequency and a maximum amplitude equal to the supply voltage. The comparator receives the carrier signal at the second input terminal and compares the carrier signal to the modulating signal, thereby producing the PWM signal at the output terminal. By creating and using a carrier signal with a maximum amplitude equal to the supply voltage, the PWM signal produced by the method is immune from changes in the supply voltage.

Another embodiment of the invention is directed to a pulse width modulation conversion system that converts an input modulating signal to a PWM signal. The system includes an analog-to-digital conversion stage, a digital counter, and a digital comparator. The analog-to-digital conversion stage converts an analog voltage reference to a digital voltage reference. The digital counter has a maximum value input coupled to the analog-to-digital conversion stage to receive the digital voltage reference. The digital counter is structured to produce a digital carrier signal having a maximum value equal to the digital voltage reference received at the maximum value input. The digital comparator is coupled to the digital counter and analog-to-digital converter and has a power input that receives the voltage reference, a first signal input that receives the input modulating signal, a second signal input that receives the carrier signal from the digital counter, and an output. The comparator is structured to produce at the output a PWM signal based on a comparison of the carrier signal with the modulating signal.

BRIEF DESCRIPTION OF THE DRAWINGS

FIG. 1 is a schematic diagram of a comparator having signal inputs and a signal output as shown.

FIG. 2 is a block diagram of a prior art system for converting a modulating signal to a PWM signal.

FIG. 3A is a time diagram of a modulating signal and a carrier signal and

FIG. 3B is a time diagram of a PWM signal resulting from a comparison of the signals of FIG. 3a.

DETAILED DESCRIPTION

Figure 4:
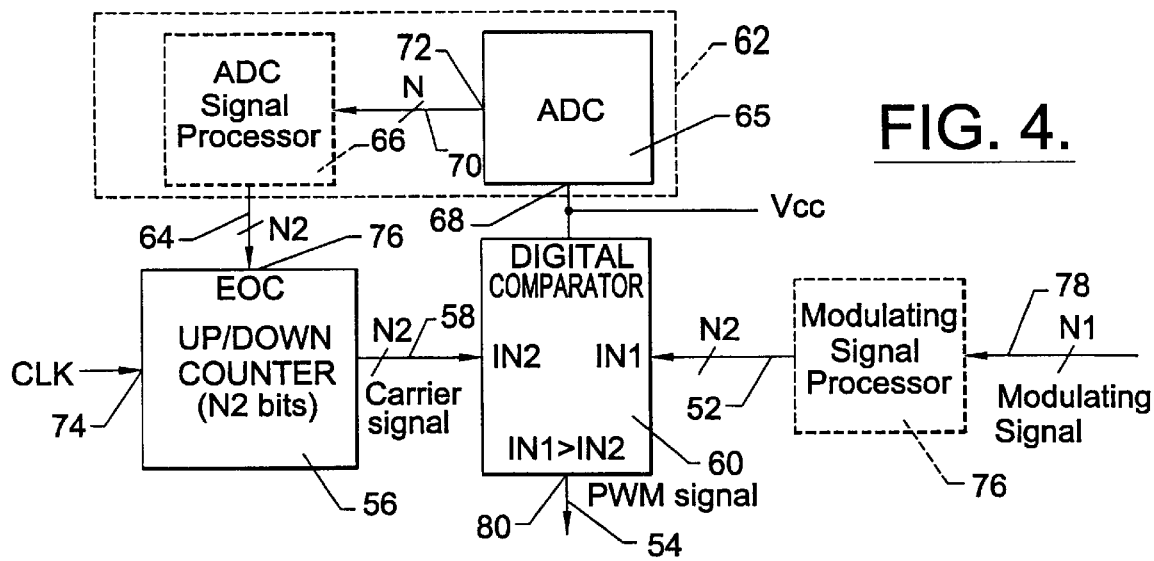
FIG. 4 is a block diagram of a system for converting a modulating signal to a PWM signal according to an embodiment of the present invention.

A PWM conversion system 50 for converting a digital modulating signal 52 to a PWM signal 54 is shown in FIG. 4. The system 50 includes a digital up/down counter (U/D counter) 56 that creates a carrier signal 58 and a digital comparator 60 that creates the PWM signal 54 based on a comparison of the modulating signal 52 with the carrier signal 58. Unlike prior art PWM conversion systems, the system 50 includes an analog-to-digital conversion stage 62 that converts a supply voltage Vcc to a digital supply signal 64 that sets the maximum value of the carrier signal 58. As will be shown in more detail below, converting the supply voltage Vcc to the digital supply signal 64 and using that signal to set the maximum value of the carrier signal 58 enables the PWM signal 54 to be immune from changes in the supply voltage Vcc.

The analog-to-digital conversion stage 62 includes an analog-to-digital converter (ADC) 65 and may include an ADC signal processor 66. The ADC 65 receives the analog supply voltage Vcc at an input 68 and converts it to an N-bit digital supply voltage 70 at an output 72. The ADC signal processor 66 converts the digital supply voltage 70 output by the ADC 65 from an N-bit digital value to an N2-bit digital value that is output as the digital supply signal 64. The ADC signal processor 66 is only needed if the N bits of the digital supply voltage 70 are different than the N2 bits that are acceptable by the U/D counter 56.

A couple of examples may be helpful to ensure an understanding of the operation of the ADC signal processor 66, First, if the U/D counter 56 can accept 8-bit (N2=8) signals and the ADC 65 only outputs 6-bit (N=6) signals, then the ADC signal processor 66 sets the two most significant bits of the digital supply signal 64 to 1 and includes the 6 bits of the digital supply voltage 70 as the 6 least significant bits without changing them. Second, if the U/D counter 56 can accept 8-bit signals and the ADC 65 outputs 10-bit signals, then the ADC signal processor 66 outputs the 8 most significant bits of the digital supply voltage 70 as the digital supply signal 64. If N=N2, then the ADC signal processor 66 is not needed and the digital supply voltage 70 output by the ADC 65 is transmitted directly to the U/D counter 56 as the digital supply signal 64.

The U/D counter 56 has a clock input 74 that receives a clock signal CLK and a maximum value input 76 that receives the digital supply signal 64. Like the prior art U/D counter 28 of FIG. 2, the U/D counter 56 counts upward one step at each pulse of the clock signal CLK until an "end of count" (EOC) value is reached. Upon reaching that value the U/D counter 56 counts downward one step at each pulse of the clock signal CLK until reaching a minimum possible value, such as zero. Upon reaching the minimum possible value, the counter again counts "up" and so forth. Unlike the prior art U/D counter 28, the EOC value for the U/D counter 56 is set to equal the digital supply signal 64 received at the maximum value input 76. As a result, the carrier signal 58 output by the U/D counter 56 increases until reaching a digital value (as expressed in the digital supply signal 64) corresponding to the analog value of the supply voltage Vcc.

It will be appreciated that the use of a UID counter is not the only possible choice. Another possibility could be that of using an counter that generates a sawtooth profile.

The system 50 also may include a modulating signal processor 76 that insures that the modulating signal 52 is expressed in a number of bits acceptable to the digital comparator 60. For example, if the modulating signal processor 76 receives a modulating signal 78 having 10 bits and the digital comparator 60 requires 8 bits, then the modulating signal processor discards the two least significant bits to create the modulating signal 52 that is acceptable to the digital comparator 60. If the modulating signal 78 is 7 bits and the comparator 60 requires 8 bits, then the modulating signal processor 76 may multiply by two (shift left operation) the modulating signal 78 to obtain the 8 bits of the modulating signal 52 that is input to the comparator 60. Of course, if the number of bits in the modulating signal 78 equals the number of bits acceptable to the comparator 60, then the modulating signal processor is not needed and the modulating signal 78 is fed directly to the comparator 60 as the modulating signal 52.

The digital comparator 60, which is powered by the analog supply voltage Vcc, includes a first input IN1 that receives the modulating signal 52, a second input IN2 that receives the carrier signal 58, and an output 80 at which the PWM signal 54 is output. At each portion of the modulating signal 52 that is greater than a corresponding portion of the carrier signal 58, the comparator 60 outputs a logic 1 for a corresponding portion of the PWM signal 54. Similarly, at each portion of the modulating signal 52 that is less than a corresponding portion of the carrier signal, the comparator 60 outputs a logic 0 for a corresponding portion of the PWM signal 54.

Converting the supply voltage Vcc to the digital supply signal 64 and using that signal to set the maximum value of the carrier signal 58 enables the PWM signal 54 to be immune from changes in the supply voltage Vcc. That desirable result occurs because, as described above, the PWM signal 54 results from a logical subtraction of the carrier signal 58 from the modulating signal 52. Since the carrier signal varies directly with the supply voltage Vcc and the comparator is powered by the supply voltage Vcc, the negative effect of the carrier signal 58 cancels the effect of the supply voltage Vcc on the PWM signal 54.

An example may help one to understand the compensation afforded by varying the carrier signal 58 with a digital version (supply signal 64) of the supply voltage Vcc. Let's assume that the supply voltage Vcc can assume values of 12 V+/−25%, the comparator requires 8 bits, and the modulating signal assumes a digital value of 102 (01100110). Configuring the ADC 65 in a way that its output will be equal to 204 when the supply voltage is equal to 12V (nominal value) we will have that the extreme values of the digital supply signal 64 will be:

12 V=204 (11001100)

12 V+25%=255 (11111111)

12 V−25%=153 (10011001).

The average value of the PWM signal 54 is equal to its duty cycle multiplied by the supply voltage Vcc provided to the comparator 60, where the duty cycle of the PWM signal 54 will be:

Duty-Cycle=(amplitude of the modulating signal)/(amplitude of the carrier signal)*100.

When the supply voltage Vcc equals its nominal value of 12 V, the PWM signal 54 has a duty cycle of 50% (102/204*100) and an average value of 6 V (12 V*50%). When the supply voltage Vcc increases to its maximum value of 15 V (12 V+25%), the PWM signal 54 has a duty cycle of 40% (102/255*100) and an average value of 6 V (15 V*40%). When the supply voltage Vcc decreases to its minimum value of 9 V (12 V−25%), the PWM signal 54 has a duty cycle of 66.67% (102/153*100) and an average value of 6 V (9 V*66.67%). Thus, the average value of the PWM signal 54 remains constant regardless of the fluctuations in the supply voltage Vcc.

Figure 5A:
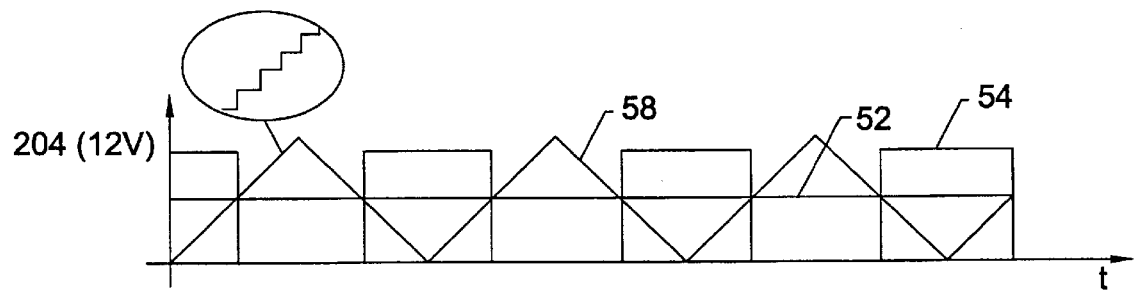
FIGS. 5A–5c are time diagrams of modulating, carrier, and PWM signals for three supply voltage values in the system of FIG. 4.
Figure 5B:
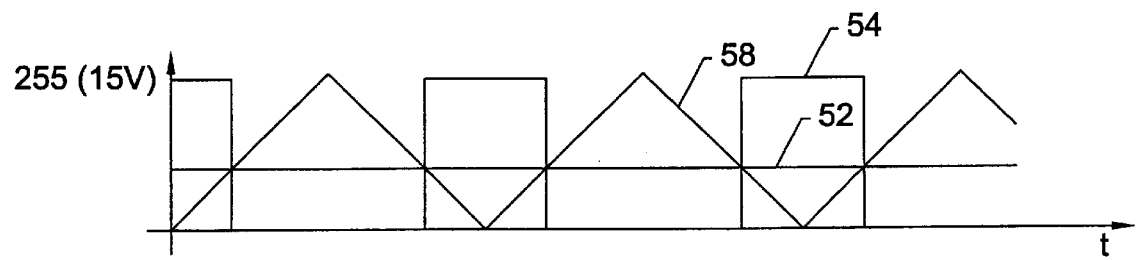
Figure 5C:
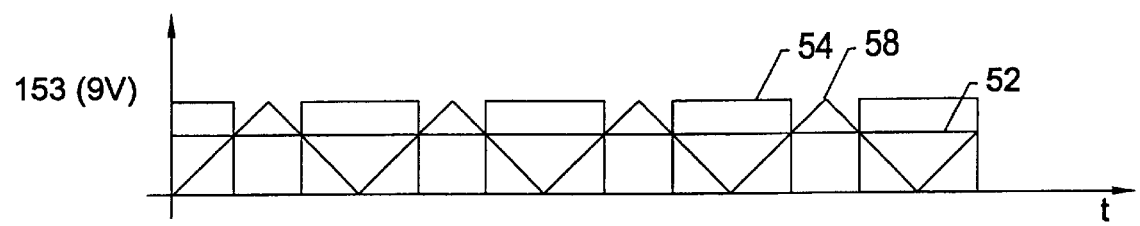

FIGS. 5A–C show the signals (carrier signal, modulating signal, and PWM signal) for the nominal value (FIGS. 5A), maximum value (FIGS. 5B), and minimum value (FIGS. 5C) of the supply voltage Vcc. As can be seen, maximum value of the carrier signal 58 varies directly with the variations of the supply voltage Vcc. Because the comparator 60 logically subtracts the carrier signal 58 from the modulating signal 52, the duty cycle of the PWM signal 54 varies inversely with the carrier signal 58 and the supply voltage Vcc. Given that the average value of the PWM signal 54 is a function of the duty cycle multiplied by the supply voltage Vcc powering the comparator 60, the average value of the PWM signal 54 is immune from variations in that supply voltage Vcc.

The method and system 50 solve the problem of the variations in the average value of the output voltage of a circuit that converts a digital number to a PWM signal whenever those variations are caused by variations in the supply voltage. The method and system 50 obtain a dynamic profile of the carrier signal 58 that follows the variations of the supply voltage Vcc. In other words, increases in the value of the supply voltage Vcc tend to produce increases in the amplitude of the carrier signal 58 in such a way that, in parity with the modulating signal 52, the duty cycle of the resulting PWM signal 54 is reduced. The proposed method is applicable to any converter of the type cited above that utilizes for the conversion a digital counter. The method is based on the observation of the value of the supply voltage by means of an analog digital converter (ADC). Once the value of the supply voltage is known, one can compute a better value for use as the value of the "end of count" (EOC) applicable to the digital counter.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of producing a PWM signal using a comparator having first and second input terminals and an output terminal at which the PWM signal is produced, the method comprising:

powering the comparator with a supply voltage;

receiving a modulating signal at the first input terminal;

creating a carrier signal with a constant frequency and a maximum amplitude equal to the supply voltage;

inputting the carrier signal at the second input terminal; and using the comparator to compare the carrier signal to the modulating signal, thereby producing the PWM signal at the output terminal.

2. The method of claim 1 wherein the modulating, carrier, and PWM signals are digital.

3. The method of claim 1 wherein the creating act includes converting the supply voltage from an analog value to a digital value and inputting the digital value of the supply voltage into a maximum value input of a digital counter that provides successive count values with a maximum count value equal to the digital value received at the maximum value input, the successive count values being the carrier signal.

4. The method of claim 3 wherein the digital counter provides successively increasing count values until the maximum count value is reached.

5. The method of claim 3 wherein the digital counter provides successively decreasing count values from the maximum count value.

6. The method of claim 3 wherein the creating act includes determining whether the analog value of the supply voltage has changed sufficiently to result in a changed digital value for the supply voltage and, if so, setting the changed digital value as the maximum count value.

7. The method of claim 3 wherein the converting act includes converting the analog supply voltage into a first digital value of x bits and converting the first digital value into a second digital value having a number of bits acceptable to the digital counter.

8. The method of claim 1 wherein the comparator is digital and outputs a logic one value if the modulating signal is greater than or equal to a digital sample of the carrier signal and outputs a logic zero if the modulating signal is less than the digital sample.

9. A method of producing a PWM signal, comprising:

powering a digital comparator with a supply voltage;

converting the supply voltage from an analog value to a digital value;

creating a digital carrier signal having a maximum count value equal to the digital value of the supply voltage; and using the digital comparator to compare the digital carrier signal with a digital modulating signal to create the PWM signal.

10. The method of claim 9 wherein the act of creating a digital carrier signal includes setting an maximum count value of a digital counter equal the digital value of the supply voltage and providing from the digital counter successive count values with a highest count value equal to the digital value of the supply voltage, the successive count values being the carrier signal.

11. The method of claim 10 wherein the digital counter provides successively increasing count values until the maximum count value is reached.

12. The method of claim 10 wherein the digital counter provides successively decreasing count values from the maximum count value.

13. The method of claim 10 wherein the act of creating the digital carrier signal includes determining whether the analog value of the supply voltage has changed sufficiently to result in a changed digital value for the supply voltage and, if so, setting the changed digital value as the maximum count value.

14. The method of claim 9 wherein the converting act includes converting the analog supply voltage into a first digital value of x bits and converting the first digital value into a second digital value having a number of bits acceptable to the digital counter.

15. The method of claim 9 wherein the comparator is digital and outputs a logic one value if the modulating signal is greater than or equal to a digital sample of the carrier signal and outputs a logic zero if the modulating signal is less than the digital sample.

16. A pulse width modulation conversion system, comprising:

an input modulating signal;

an analog-to-digital conversion stage that converts an analog voltage reference to a digital voltage reference;

a digital counter having a maximum value input coupled to the analog-to-digital conversion stage to receive the digital voltage reference, the digital counter being structured to produce a digital carrier signal having a maximum value equal to the digital voltage reference received at the maximum value input; and a digital comparator coupled to the digital counter and analog-to-digital converter and having a power input that receives the voltage reference, a first signal input that receives the input modulating signal, a second signal input that receives the carrier signal from the digital counter, and an output, the comparator being structured to produce at the output a PWM signal based on a comparison of the carrier signal with the modulating signal.

17. The pulse width modulation conversion system of claim 16 wherein the analog-to-digital conversion stage includes an analog-to-digital converter that produces a digital voltage reference of x bits and an elaboration circuit that converts the digital voltage reference of x bits to a digital voltage reference having a number of bits acceptable to the digital counter.

18. The pulse width modulation conversion system of claim 16 wherein the digital counter is an up counter that is structured to count upward until reaching the maximum count value.

19. The pulse width modulation conversion system of claim 16 wherein the digital counter is down counter that is structured to count downward from the maximum count value.

* * * * *